US009746608B1

(12) United States Patent
Rabiei

(10) Patent No.: US 9,746,608 B1
(45) Date of Patent: Aug. 29, 2017

(54) INTEGRATED OPTICAL ASSEMBLY APPARATUS AND INTEGRATED FABRICATION METHOD FOR COUPLING OPTICAL ENERGY

(71) Applicant: Payam Rabiei, Orlando, FL (US)

(72) Inventor: Payam Rabiei, Orlando, FL (US)

(73) Assignee: Partow Technologies, LLC., Vista, CA (US)

( * ) Notice: Subject to any disclaimer, the term of this patent is extended or adjusted under 35 U.S.C. 154(b) by 0 days.

(21) Appl. No.: 14/967,196

(22) Filed: Dec. 11, 2015

Related U.S. Application Data

(60) Provisional application No. 62/090,738, filed on Dec. 11, 2014.

(51) Int. Cl.
| | |
|---|---|
| *G02B 6/32* | (2006.01) |
| *G02B 6/124* | (2006.01) |
| *G02B 6/42* | (2006.01) |
| *G02B 6/122* | (2006.01) |
| *G03F 7/00* | (2006.01) |
| *G03F 7/20* | (2006.01) |
| *G03F 7/16* | (2006.01) |
| *G02B 6/12* | (2006.01) |

(52) U.S. Cl.
CPC ........... *G02B 6/124* (2013.01); *G02B 6/1223* (2013.01); *G02B 6/1228* (2013.01); *G02B 6/4203* (2013.01); *G02B 6/4214* (2013.01); *G03F 7/0005* (2013.01); *G03F 7/16* (2013.01); *G03F 7/2022* (2013.01); *G02B 2006/12104* (2013.01); *G02B 2006/12107* (2013.01)

(58) Field of Classification Search
CPC .... G02B 6/124; G02B 6/1223; G02B 6/1228; G02B 6/4203; G02B 6/4214; G02B 2006/12104; G02B 2006/12107; G02B 206/12171; G03F 7/0005; G03F 7/16; G03F 7/2022
USPC ........................................ 385/15, 31, 33, 37
See application file for complete search history.

(56) References Cited

U.S. PATENT DOCUMENTS

| | | | | |
|---|---|---|---|---|
| 5,058,124 | A | * | 10/1991 | Cameron .............. H01S 3/1055 359/224.1 |
| 5,208,882 | A | * | 5/1993 | Strasser ................... G02B 6/34 385/130 |

(Continued)

*Primary Examiner* — Ryan Lepisto
*Assistant Examiner* — Guy Anderson
(74) *Attorney, Agent, or Firm* — Invent Capture, LLC.; Samuel S. Cho

(57) ABSTRACT

A novel optical assembly apparatus for coupling optical energy and a related method for creating the novel optical assembly apparatus are disclosed. In one embodiment, the novel optical assembly apparatus includes a high-index contrast waveguide constructed on a semiconductor die or another base substrate with an aligned optical coupling section, a grating coupler etched onto a surface, a micro mirror with an acute angle relative to the surface, and a waveguide taper that narrows an optical beam width. A light ray entered into the optical coupling section is redirected by the micro mirror to form a perpendicular ray entry angle with the grating coupler. The grating coupler then efficiently couples the light ray with the waveguide taper, which in turn narrows the optical beam width. The light ray may originate from a semiconductor die or from an optical fiber, which is purposefully aligned with the high-index contrast waveguide.

11 Claims, 14 Drawing Sheets

(56) References Cited

U.S. PATENT DOCUMENTS

| | | | |
|---|---|---|---|
| 6,293,688 B1* | 9/2001 | Deacon | G02B 6/1228 362/551 |
| 7,162,124 B1* | 1/2007 | Gunn, III | G02B 6/30 385/27 |
| 7,428,358 B2* | 9/2008 | Lu | B82Y 20/00 385/129 |
| 8,837,884 B2* | 9/2014 | Suzuki | G02B 6/305 385/27 |
| 9,285,554 B2* | 3/2016 | Doany | G02B 6/4214 |
| 9,484,482 B2* | 11/2016 | Hsu | G02B 6/4214 |
| 9,494,741 B2* | 11/2016 | Gardes | G02B 6/30 |
| 2002/0076149 A1* | 6/2002 | Deacon | G02B 6/1228 385/27 |
| 2004/0042377 A1* | 3/2004 | Nikolai | B82Y 20/00 369/112.09 |
| 2004/0258360 A1* | 12/2004 | Lim | B82Y 20/00 385/43 |
| 2005/0201683 A1* | 9/2005 | Ghiron | G02B 6/4204 385/39 |
| 2005/0243875 A1* | 11/2005 | Le | H01S 5/143 372/20 |
| 2007/0031088 A1* | 2/2007 | Lu | B82Y 20/00 385/49 |
| 2008/0181264 A1* | 7/2008 | Mizuyama | H01S 5/02 372/20 |
| 2010/0074584 A1* | 3/2010 | Jin | G02B 6/13 385/123 |
| 2010/0084261 A1* | 4/2010 | Lee | G02B 6/138 204/192.26 |
| 2010/0202734 A1* | 8/2010 | DeCorby | G01J 3/02 385/43 |
| 2010/0211124 A1* | 8/2010 | Ni | G09B 23/288 607/4 |
| 2010/0278484 A1* | 11/2010 | Scheerlinck | G01M 11/35 385/37 |
| 2011/0052114 A1* | 3/2011 | Bernasconi | H01S 5/026 385/3 |
| 2011/0075970 A1* | 3/2011 | Schrauwen | G02B 6/124 385/37 |
| 2011/0142395 A1* | 6/2011 | Fortusini | G02B 6/34 385/37 |
| 2012/0195336 A1* | 8/2012 | Fang | H01S 5/026 372/45.01 |
| 2013/0182998 A1* | 7/2013 | Andry | G02B 6/4204 385/33 |
| 2013/0209026 A1* | 8/2013 | Doany | G02B 6/4214 385/14 |
| 2014/0153601 A1* | 6/2014 | Doerr | H01S 5/125 372/44.01 |
| 2015/0286008 A1* | 10/2015 | Shimizu | G02B 6/34 385/37 |
| 2015/0378095 A1* | 12/2015 | Hsu | G02B 6/4214 385/14 |
| 2016/0116680 A1* | 4/2016 | Ling | G02B 5/1809 385/1 |
| 2016/0238787 A1* | 8/2016 | Nadovich | G02B 6/1225 |
| 2016/0248225 A1* | 8/2016 | Sayyah | H01S 5/0228 |

* cited by examiner

INTEGRATED OPTICAL ASSEMBLY APPARATUS AND INTEGRATED FABRICATION METHOD FOR COUPLING OPTICAL ENERGY

FIELD OF THE INVENTION

The present invention generally relates to a method for production of optical elements to produce an optical integrated circuit. Furthermore, the present invention also relates to a method for coupling optical energy from an optical fiber to high-index contrast optical waveguides. Moreover, the present invention introduces a method to achieve a wavelength tunable laser module. In addition, the method introduced here relates to integrated assembly of semiconductor lasers with lithium niobate high-index contrast waveguides and optical fibers to create an optical integrated circuit. Furthermore, the present invention introduces a method for making high-index contrast waveguide in lithium niobate and lithium tantalate.

BACKGROUND OF THE INVENTION

In numerous electronic communication applications, optical assemblies are used in various optical circuits. A typical optical assembly may comprise an optical source, an optical circuit that modulate, filter, mix optical and electronic signals and an optical fiber that connect the assembly to other element in an optical system. By combining various element in an optical assembly it is possible to create various optical elements. For example an optical assembly for a telecommunication system may comprises several semiconductor lasers, optical modulators and multiplexers to generate WDM signals that can be sent over an optical fiber. A second example for an optical assembly might be an assembly for detection of wavelength of a fiber Bragg grating in an optical sensing systems. The assembly may include one or several semiconductor optical sources, electro-optic modulators, wavelength de-multiplexers and wavelength detecting elements and optical detectors. The assembly is generally integrated and packaged into small form factor electronic packages and optical fibers and wires connect the assembly to external elements in the system.

Several methods have been used in the past to achieve integrated optical assemblies.

In one example, US2011/0013869A1 publication discloses a method for creating an optical assembly by using a plurality of small micro-lenses that are manipulated by a micro-electromechanical devices in order to achieve necessary alignment tolerances. This method for making an optical assembly requires a plurality of small optical lenses and individual alignment for each lens.

Furthermore, for coupling light from an optical fiber to a high-index contrast waveguide, several methods have been disclosed in the past. In one example, US2010/0135615A1 and U.S. Pat. No. 7,643,719B1 publications disclose a coupling mechanism based on a graded-index (GRIN) lens, which is deposited on a substrate's surface and is etched into the substrate to form a GRIN lens in the vertical direction. In this example, a patterned edge is created and forms a curved surface for horizontal focusing in order to couple light from an optical fiber to a high-index contrast waveguide. The GRIN lens method disclosed in these publications requires a precise control of refractive index profile, and it is generally difficult to manufacture an exact refractive index profile with a high level of precision.

Other conventional methods for coupling light from an optical fiber to high-index contrast waveguides include using grating couplers. For example, U.S. Pat. No. 5,033,812 and U.S. Pat. No. 5,101,459 publications disclose a grating device formed on the surface of the device. In this example, the grating device is used to couple the light from an optical fiber or free space to the high-contrast waveguide.

Another type of conventional coupling method is related to tapered waveguides for coupling of optical energy between an optical fiber and a high-index contrast waveguide. For example, U.S. Pat. No. 7,239,779B2 discloses a method to achieve optical coupling via transfer of energy between waveguides on different layers. This method related to tapered waveguides were used for coupling optical energy between an optical fiber and a high-index contrast waveguide.

A micro-mirror for board-level interconnects is disclosed in the publication "F. Wang et. al, Optics Express, Vol 17, No 13, pp 10514, 2009". In this method of fabrication a 45 degree reflection surface is created in a polymer film by exposure at an angle inside water to make a 45 degree reflecting surface.

It may also be beneficial to devise a novel method to couple light from a semiconductor laser to high-index contrast waveguide in an optical assembly and also couple light between single mode optical fiber to a high-index contrast optical waveguide. Because the mode size of a nano-waveguide is very small compared to the mode size of an optical fiber (i.e. typically less than 1 micron for a nano waveguide, compared to 10 microns for an optical fiber), the coupling efficiency from an optical fiber to a high-index contrast waveguide is very poor. Furthermore, due to a large diffraction of light, the coupling efficiency between semiconductor lasers and planar optical waveguides is often unsatisfactory.

Therefore, a novel optical assembly apparatus that can couple light with improved coupling efficiency between a semiconductor laser and a planer high-index contrast waveguide, or between an optical fiber and a planer high-index contrast, may be desirable. Furthermore, a novel method to manufacture and process such novel optical assembly apparatuses may also be desirable. In addition, a novel method to tune a wavelength of the laser by utilizing the novel optical assembly apparatus may also be desirable.

SUMMARY

Summary and Abstract summarize some aspects of the present invention. Simplifications or omissions may have been made to avoid obscuring the purpose of the Summary or the Abstract. These simplifications or omissions are not intended to limit the scope of the present invention.

In one embodiment of the invention, an optical assembly apparatus for coupling optical energy between a high-index contrast waveguide and a light source is disclosed. This apparatus comprises: a high-index contrast waveguide fabricated on a base substrate (e.g. 101 of FIG. 1a) with an optical coupling section (e.g. 106 of FIG. 1a); a grating coupler (e.g. 102 of FIG. 1a) etched onto a horizontal surface of the high-index contrast waveguide; a lithographically-defined and aligned micro mirror (e.g. 105 of FIG. 1a) with an acute angle (e.g. 115 of FIG. 1a) formed in a UV cross-linkable polymer material on top of the grating coupler, wherein the acute angle is configured to redirect the light source into the grating coupler to form a perpendicular ray entry angle with the grating coupler on the horizontal surface of the high-index contrast waveguide; and the light source aligned to the optical coupling section (e.g. 106 of FIG. 1*a*).

In another embodiment of the invention, a method for producing coupling section (e.g. 105 of FIG. 1*a*) with a micro mirror having an acute angle (e.g. 115 of FIG. 1*a*) formed on top of a grating coupler in an optical assembly apparatus for coupling optical energy between a high-index contrast waveguide and a light source is disclosed. This method comprises the steps of: spin-coating a UV cross-linkable material on a base substrate that for the high-index contrast waveguide; creating a body of the micro mirror and a body of optional micro lens by performing optical alignment to high-index contrast waveguide and UV exposure to cross link the UV cross-linkable material on the base substrate; depositing a metal layer or spin-coating a UV-absorbing layer on top of the UV cross-linkable material; optically aligning and lithographically defining a photo-resist layer deposited on the metal layer, and also defining a window for a UV light in the metal layer by etching or optically-aligning and UV-bleaching the UV-absorbing layer to create the window for the UV light in the UV-absorbing layer; forming a body of the micro mirror via angled photo exposure in water or another liquid to crosslink the UV cross-linkable material through the window in the metal layer or the UV-absorbing layer; removing the metal layer or UV absorbing layer dissolving unexposed regions of the UV cross-linkable material; and depositing silver, gold, or aluminum as a reflector material on the surface of the micro mirror to formulate a highly-reflective mirror.

Yet in another embodiment of the invention, a method for producing coupling section with a micro mirror having an acute angle formed on top of a grating coupler in an optical assembly apparatus for coupling optical energy between a high-index contrast waveguide and a light source is disclosed. This method comprises the steps of: spin-coating a UV cross-linkable material on a base substrate with the high-index contrast waveguide and a grating coupler; creating a body of the micro mirror and a body of an optional micro lens by performing optical alignment to high-index contrast waveguide and UV exposure through a photo-mask to cross link the UV cross-linkable material on the base substrate; forming an acute-angled surface of micro mirror via angled photo exposure in water or another liquid to crosslink the UV cross-linkable material through an aligned window or photo-mask; and depositing silver, gold, or aluminum as a reflector material on the surface of the micro mirror to formulate a highly-reflective mirror.

In another embodiment of the invention, an apparatus for creating an optical assembly comprising a semiconductor laser and an electro-optic planer high-index contrast waveguide and coupling sections is disclosed. This coupling section comprises a high-index planar waveguide made from electro-optic materials, grating coupler device made in the high-index contrast planar waveguide, a polymer mirror and an optional cylindrical lens made using a polymer material and integrated with the high-index contrast planar waveguide and a semiconductor laser which is placed in a precise location with respect to planar high-index contrast chip.

In another embodiment of the invention, an apparatus for coupling optical signals between an optical fiber and a planar high-index contrast waveguide is disclosed. This apparatus comprises a grating coupler device made in the high-index contrast planar waveguide, a polymer mirror and an optional cylindrical lens made using a polymer material and integrated with the high-index contrast planar waveguide and an optical fiber which is placed or attached in a precise location with respect to planar high-index contrast chip.

In another embodiment of the invention, a method for fabrication of the coupling apparatus and a method for fabrication of high-index contrast waveguide in lithium niobate and lithium tantalate is disclosed.

In another embodiment of the invention, an apparatus for making a tunable laser is disclosed. The apparatus comprises a semiconductor laser, a planar high-index contrast waveguide, a grating coupler device made in high-index contrast waveguide, a mirror and a cylindrical lens using polymer materials a reflector made in planer high-index contrast waveguide and a phase tuning section made in high-index planer waveguide, and a tunable positioner element to place the semiconductor laser at a precise tunable position with respect to planar high-index contrast chip.

DETAILED DESCRIPTION

Figure 1A:
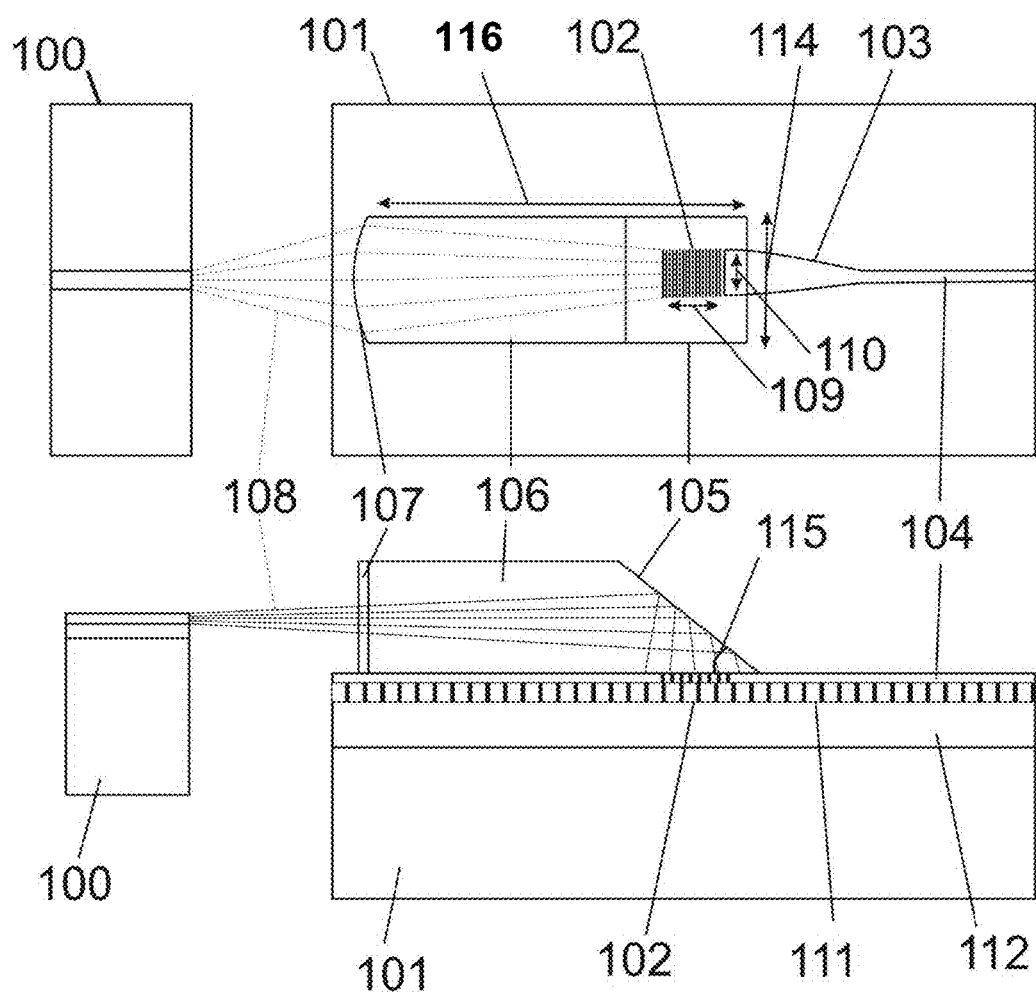
FIG. 1*a* shows a top view and a side view of an optical assembly that includes a high-index contrast waveguide and a coupling apparatus for coupling optical signals between a semiconductor laser and planar high-index contrast waveguide, in accordance with an embodiment of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The detailed description is presented largely in terms of procedures, logic blocks, processing, and/or other symbolic representations that directly or indirectly resemble an optical waveguide production method, and optical coupler apparatuses and devices utilizing the optical waveguide production method, in accordance with various embodiments of the invention. These apparatus and process descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment. Furthermore, separate or alternative embodiments are not necessarily mutually exclusive of other embodiments. Moreover, the order of blocks in process flowcharts or diagrams representing one or more embodiments of the invention do not inherently indicate any particular order nor imply any limitations in the invention.

For the purpose of describing the invention, a term "low refractive index material" is generally defined as having a refractive index less than 1.6. Furthermore, for the purpose of describing the invention, a term "high refractive index material" is generally defined as having a refractive index of 2 or higher.

In one embodiment of the invention, a method to fabricate a high-index contrast waveguide and integrated coupler to couple optical energy from a semiconductor laser or an optical fiber to a high-index contrast waveguide is disclosed. The method comprises fabrication of a high-index contrast device, creating a polymer micro-mirror and micro-lens that is integrated with high-index contrast planar waveguide to couple light from high-index contrast device to an optical fiber or semiconductor laser. This method allows efficient coupling to be achieved between semiconductor laser or optical fibers and planar high-index contrast waveguides to create an optical assembly.

Figure 1B:
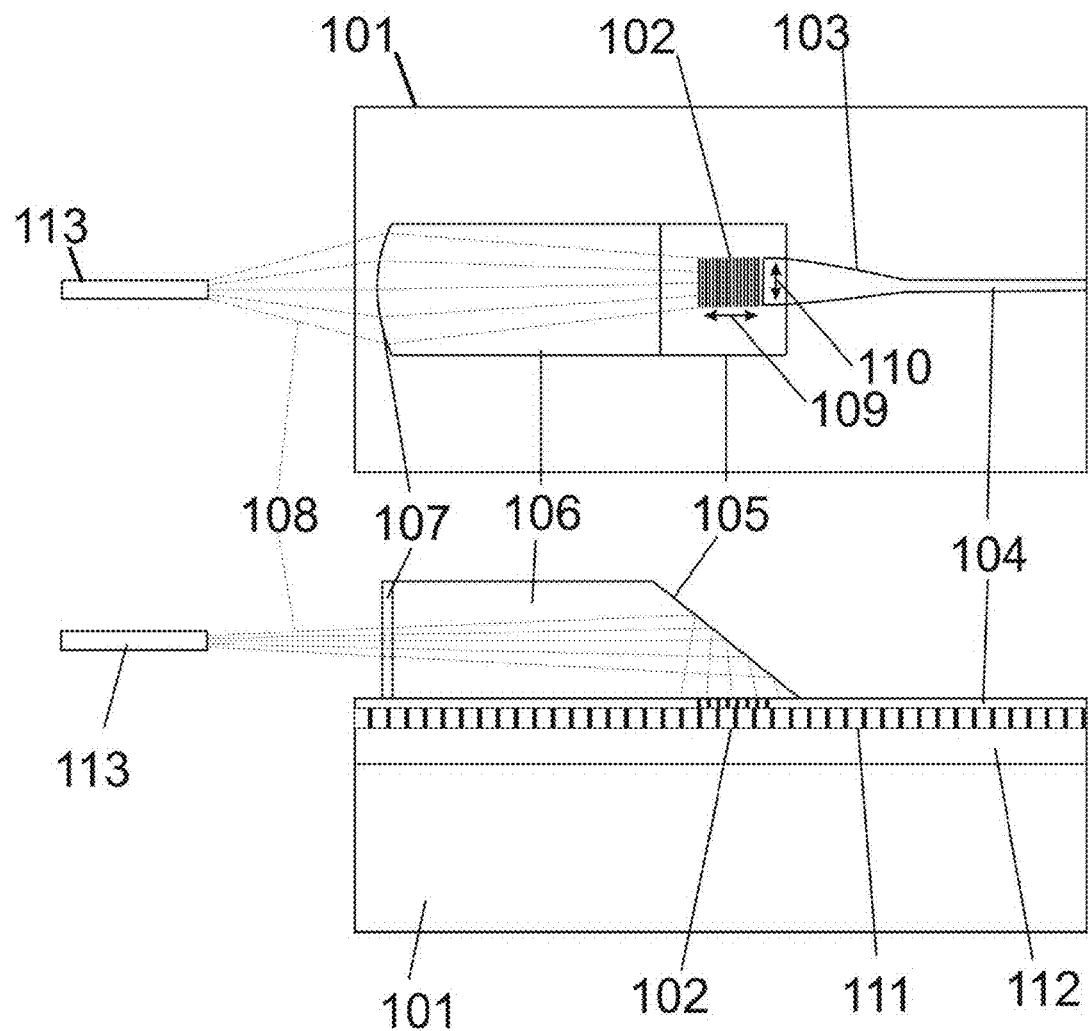
FIG. 1*b* shows a top view and a side view of a coupling apparatus for coupling optical signals between an optical fiber and planar high-index contrast waveguide, in accordance with an embodiment of the invention.

An optical assembly in accordance with an embodiment of the invention is shown in FIGS. 1a and 1b. The optical assembly comprises one or more semiconductor laser dice (100), one or more optical fibers (113), a high-index contrast planar waveguide that includes a substrate (101), a cladding region (112) a slab core region (111), a ridge core waveguide region (e.g. 104), a grating coupler (102), a waveguide taper (103) and a guided mode (104) on a high-index contrast waveguide. The high-index contrast waveguide can be made of lithium tantalite, silicon nitride, aluminum nitride, silicon, tantalum pentoxide, lithium niobate, or any other material which is suitable for forming a high-index contrast waveguide. The grating coupler (102) can be a straight type or a focusing type, and can be etched simultaneously with a ridge core layer, or alternatively, etched separately. The high-index contrast waveguide may include several subsequent circuits for modulation, multiplexing, or other functions that are typically performed on optical signals. Examples of such optical circuits are subsequently described in association with some figures.

In one embodiment of the invention, an optical assembly and an apparatus for coupling energy from one or more light sources (e.g. a semiconductor laser, an optical fiber, etc.) to a planar high-index contrast waveguide comprises the following elements:

1) a high-index contrast waveguide die (101) comprising a cladding region (112), a slab core region (111) made from electro-optic materials, and a ridge core waveguide region (e.g. 104) made from high-index oxide or high-index nitride materials.

2) one or more semiconductor lasers (100) utilized as a light source.

3) one or more optical fibers (113) utilized to carry optical signals to or off the chip.

4) a coupling section (106) with a coupling section length (116) and a coupling section width (114) that couples and connects the light from a semiconductor laser to high-index contrast waveguides or vise-versa or from high-index contrast waveguide to optical fibers or vise-versa, wherein the coupling section (106) comprises:

4a) a cylindrical micro-lens element (107) configured to focus the optical beams emitted by the semiconductor laser (100) or an optical fiber (113) and propagating in a plane parallel to surface of the high-index contrast planar waveguide and the semiconductor laser. The cylindrical micro-lens element (107) may be an optional structure and is typically located in front of the coupling section (106). The focused beam is configured to match to the width (110) of the grating coupler (102) for efficient coupling;

4b) an air-free space (108) or a polymer-free space in the coupling section (106) to expand the beam to match to the length (109) of the grating coupler device for efficient coupling;

4c) a reflection surface to bend the optical beams propagating parallel to the surface of the chip by approximately 90 degrees to become perpendicular to the surface of the chip, which is achieved by a micro-mirror (105) typically formed in a UV cross-linkable polymer material with an acute angle (115) integrated with the polymer free space or the UV cross-linkable polymeric coupler section in the coupling section (106) and cylindrical micro-lens element (107);

4d) a grating coupler (102) etched into the high-index waveguide, which efficiently couples the beams hitting its surface perpendicularly to a guided mode (104) of a high-index contrast waveguide. The grating coupler (102) typically incorporates a particular emission pattern that increases or decreases a grating coupling bandwidth by introducing phase and amplitude in an emission profile via adjustment of a grating grove teeth and period;

4e) a waveguide taper (103) to convert the relatively large beam width (i.e. 110) in the grating coupler to optical mode of a high-index contrast waveguide (104) by tapering the high-index contrast waveguide using various tapering schemes.

In a preferred embodiment of the invention, the micro-mirror (105) can be made from an epoxy-based negative photoresist or a UV cross-linkable polymer material with a thickness ranging from 10 microns to 200 microns. Furthermore, in the preferred embodiment, the length of the UV cross-linkable polymer material may be between 30 microns and 1 millimeters.

Moreover, in the preferred embodiment, the angle (115) of the micro-mirror (105) may be an acute angle relative to a surface of the high-index contrast waveguide, with the acute angle preferably ranging between 30 degrees and 80 degrees. In addition, in one embodiment of the invention, a vertical position of the light source can be adjusted by a piezoelectric element to tune light wavelength between the light source and the high-index contrast waveguide to achieve a tunable laser module.

In one embodiment of the invention, a method for producing the optical assembly of FIG. 1*a* and FIG. 1*b* is disclosed, which enables an efficient and simplified manufacturing of the optical assembly that contains a semiconductor laser, optical fibers, and a high-index contrast optical waveguide die.

Figure 1C:
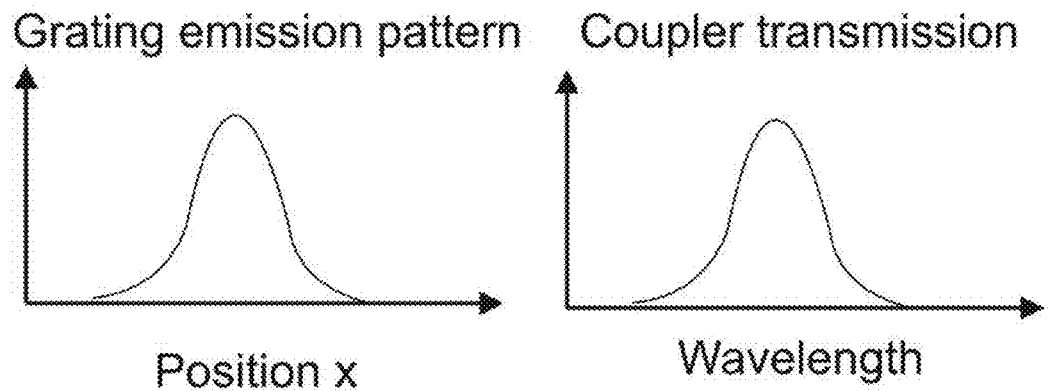
FIG. 1*c* shows an emission pattern and a coupler transmission pattern for a grating to achieve maximum optical coupling between an optical fiber and a high-index contrast waveguide, in accordance with an embodiment of the invention.
Figure 1D:
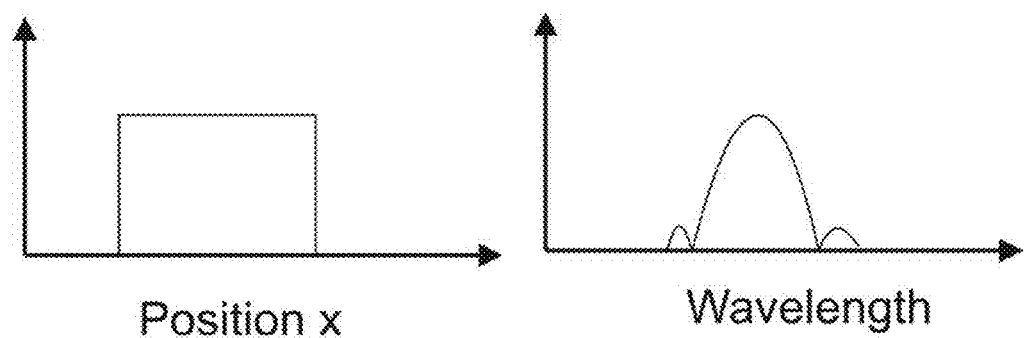
FIG. 1*d* shows an emission pattern and a coupler transmission pattern to achieve a minimum bandwidth in transmission between a semiconductor laser and the high-index contrast waveguide, in accordance with an embodiment of the invention.
Figure 1E:
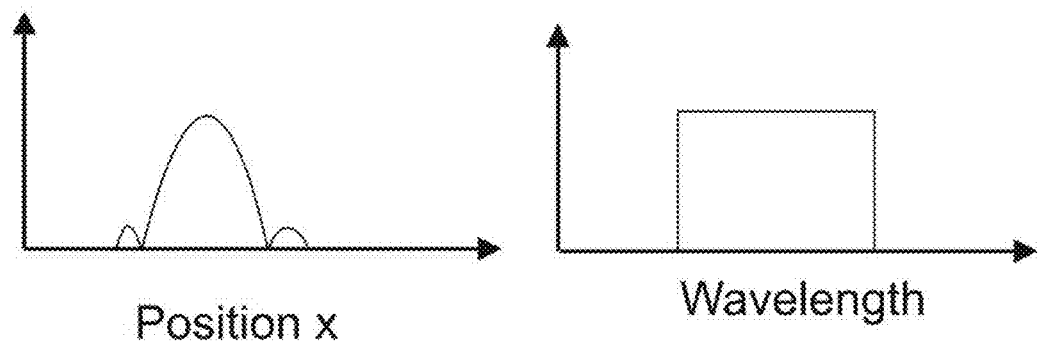
FIG. 1*e* shows an emission pattern and a coupler transmission pattern to achieve a wideband coupling between a grating and an optical fiber, in accordance with an embodiment of the invention.

Furthermore, in one embodiment of the invention, the coupler apparatus allows specific optical wavelength to be coupled between the semiconductor laser and planar high-index contrast waveguide circuit or between an optical wafer and high-index contrast waveguide. Due to wavelength selectivity of the grating coupler, unwanted noise signals can be filtered during coupling, which improves the signal to noise ratio. Depending on a particular coupling scheme, the grating design may vary. FIGS. 1*c*~1*e* show variations of emission patterns of the grating that can be obtained by designing, tuning, and configuring the periodicity and the pitch of the grating coupler device. For example, the emission pattern can be optimized to result in a Gaussian emission pattern, as shown in FIG. 1*c*, to achieve a maximum coupling between an optical fiber and the high-index contrast waveguide. In another example, it can be a constant-intensity emission pattern, as shown in FIG. 1*d*, to achieve a minimum bandwidth coupling between a semiconductor laser and the high-index contrast waveguide, which may be desired in a tunable laser application. In another example, the emission pattern may be patterned as a sinc function, as shown in FIG. 1*e*, to achieve a wideband coupling between an optical fiber and the high-index contrast waveguide. In some instances, the phase of the emitted pattern may need to be adjusted by a proper periodicity and filling factor design of grating coupler, which enables an appropriate focusing of an optical signal on a surface of semiconductor laser or an optical fiber for a desirable optical coupling. The design of these gratings, including the phase and the emission pattern intensity, can be achieved by varying the periodicity and the filling factor of the grating.

Figure 12:
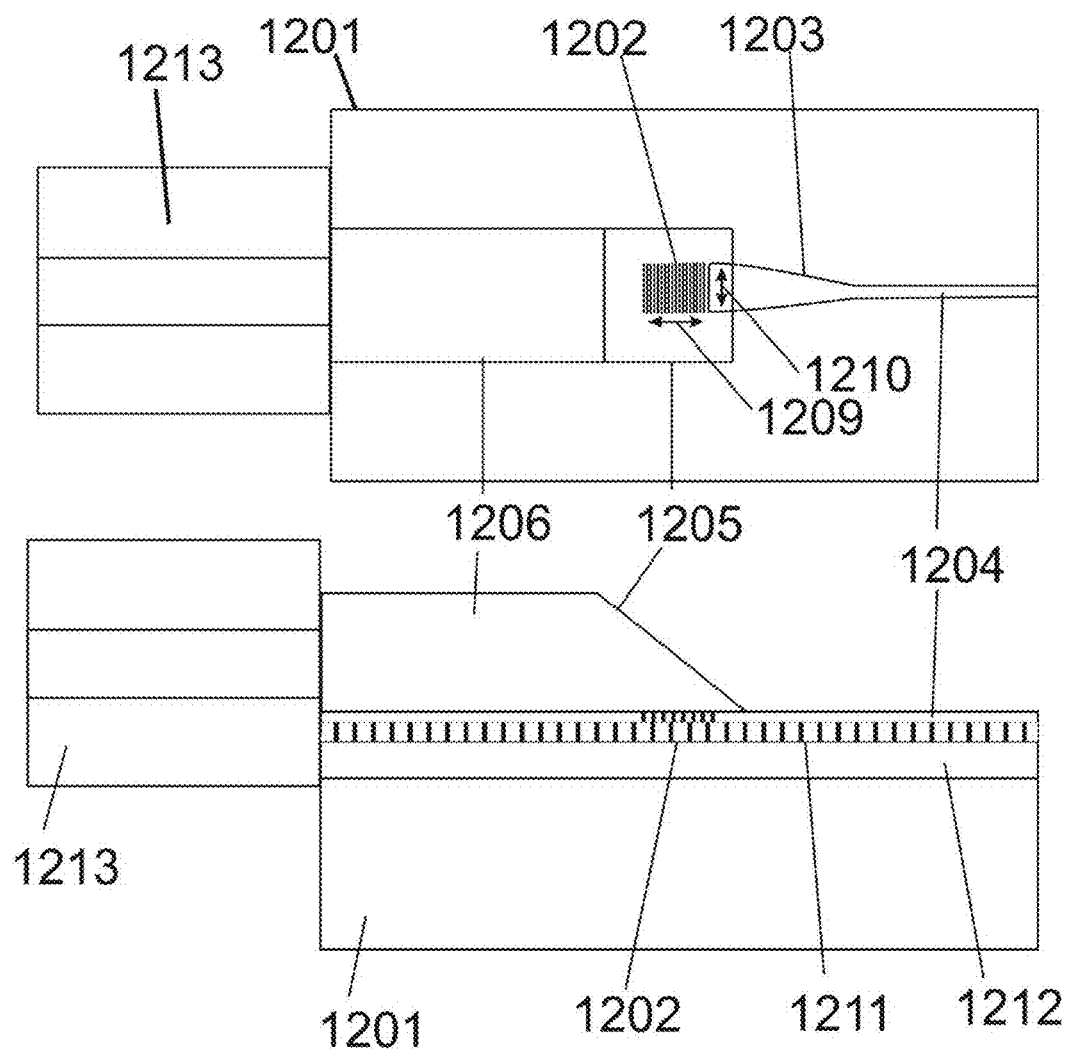
FIG. 12 shows a top view and a side view of an optical assembly that includes a high-index contrast waveguide and a coupling apparatus for coupling optical signals between and an optical fiber that is attached to coupling assembly, in accordance with an embodiment of the invention.

Alternatively, another method for coupling the light between an optical fiber and an high-index contrast optical circuit is embodied by a top view and a side view of an optical assembly, as shown in FIG. 12. The optical assembly and coupling configurations in FIG. 12 are similar to those in FIG. 1*a*, with some notable differences. In particular, instead of utilizing a cylindrical micro-lens element (e.g. 107 of FIG. 1*a*), an optical fiber (1213) is directly attached to a UV cross-linkable polymeric coupler section (1206) using a UV-curing epoxy. The optical assembly and the light coupling method embodied by FIG. 12 utilizes a physical trait of a short polymer section length that minimizes the divergence of optical beam, which in turn makes integration of a micro-lens section unnecessary. This design may achieve better coupling in at least some cases, because the reflection of the surface of the fiber and the lens section is eliminated. Furthermore, the assembly of the device may be easier when this method is utilized.

Similar to the optical assembly shown previously shown in FIG. 1*a*, the optical assembly as shown in FIG. 12 additionally comprises a high-index planar waveguide die that includes a substrate (1201), a cladding region (1212), a slab core region (1211), a ridge core waveguide region (1204), a grating coupler (1202), a waveguide taper (1203) and a high-index contrast waveguide (1204). The high-index contrast waveguide can be made of silicon, tantalum pentoxide, lithium niobate, aluminum nitride, silicon nitride, silicon or any other material which is suitable for forming a high-index contrast waveguide. The grating coupler (1202) can be a straight type or a focusing type, and can be etched simultaneously with a ridge core layer, or alternatively, etched separately. The high-index contrast waveguide may include several subsequent circuits for modulation, multiplexing, or other functions that are typically performed on optical signals.

In one embodiment of the invention, an optical assembly and an apparatus for coupling energy from semiconductor laser and an optical fiber to planar high-index contrast waveguide comprises the following elements:

1) a high-index contrast waveguide die (1201) comprising a cladding region (1212), a slab core region (1211) made from electro-optic materials, and a ridge core waveguide region (1204) made from high-index oxide or high-index nitride materials.

2) one or more semiconductor lasers utilized as a light source.

3) one or more optical fibers (1213) utilized to carry optical signals to or off the chip.

4) a coupling section (1206) that couples and connects the light from a semiconductor laser to high-index contrast waveguides or from high-index contrast waveguide to optical fibers, wherein the coupling section (1206) comprises:

4a) a UV cross-linkable polymeric coupler section (1206) that accommodates the light source to match the width (1210) and the length (1209) of the grating coupler (1202) for efficient coupling;

4b) a reflection surface to bend the optical beams propagating parallel to the surface of the chip by approximately 90 degrees to become perpendicular to the surface of the chip, which is achieved by a micro-mirror (1205) with an angle that is integrated with the coupling section (1206);

4c) a grating coupler (1202) etched into the high-index waveguide, which efficiently couples the beams hitting its surface perpendicularly to a guided mode (1204) of a high-index contrast waveguide;

4d) a waveguide taper (1203) to convert the relatively large beam width (i.e. 1210) in the grating coupler to optical mode of a high-index contrast waveguide (1204) by tapering the high-index contrast waveguide using various tapering schemes.

Figure 2A:
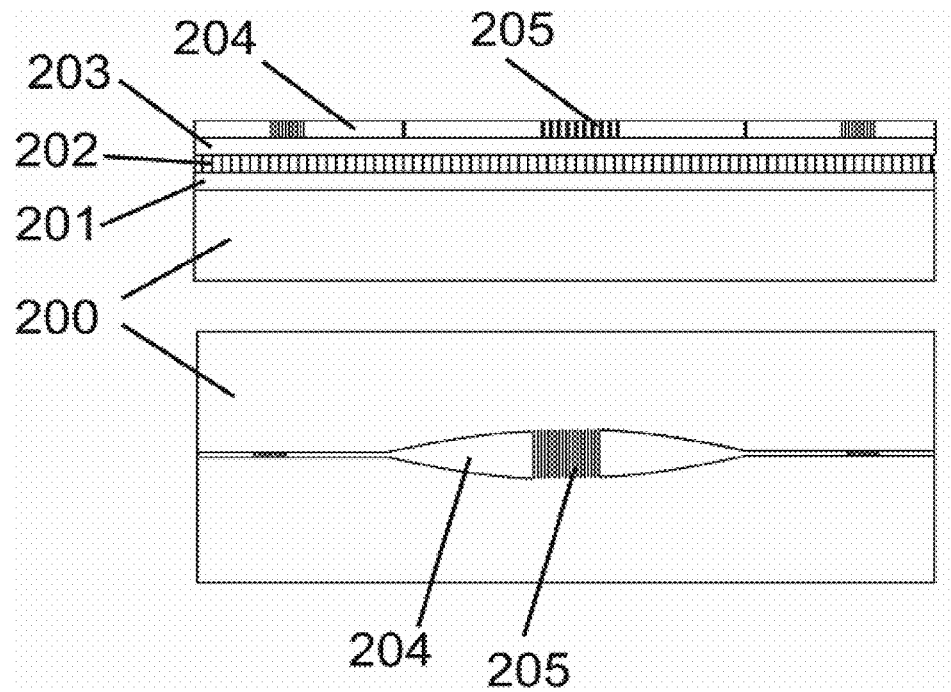
FIG. 2*a* shows a lateral view of a process step for fabrication of a high-index planar waveguide, and a corresponding top view, in accordance with an embodiment of the invention.

FIGS. 2a~2h show fabrication steps for a coupler and a high-index contrast waveguide in electro-optic materials, in accordance with an embodiment of the invention. For this embodiment, the fabrication process steps are described as follows:

1) A first processing step, as shown FIG. 2a, starts with a substrate comprising a silicon base substrate (200), a lower cladding layer (201), an electro-optic thin film layer (202), and a high-index waveguide layer (203). Furthermore, a photo-resist or e-beam resist (204) is spin-coated and patterned using UV light, x-ray light, or an electron beam to form the optical circuit and the grating coupler (205) device in the resist (204).

Figure 2B:
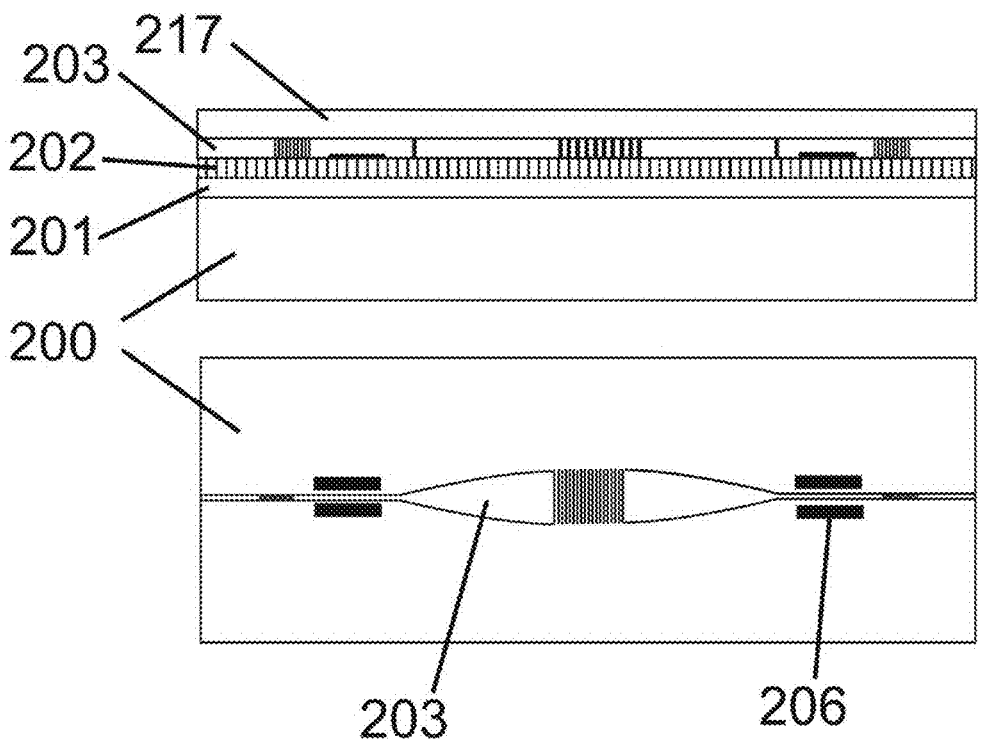
FIG. 2*b* shows a lateral view of a subsequent process step for fabrication of the high-index planar waveguide, and a corresponding top view, in accordance with an embodiment of the invention.

2) In a second processing step, as shown in FIG. 2b, the pattern in the resist (204) is transferred to the high-index waveguide layer (203) by an etching process. After this step, a ridge waveguide is formed, with a slab layer made from an electro-optic thin film layer (202), and a rib layer made from the high-index waveguide layer (203). Subsequently electrode layers (206) are deposited, aligned, and patterned on the base substrate (200). Other cladding layers (217) and interconnect layers (not shown in the figure, as they are well-known in the art and unnecessarily complicate the figures) are deposited, patterned, and etched to form the device interconnection structure.

Figure 2C:
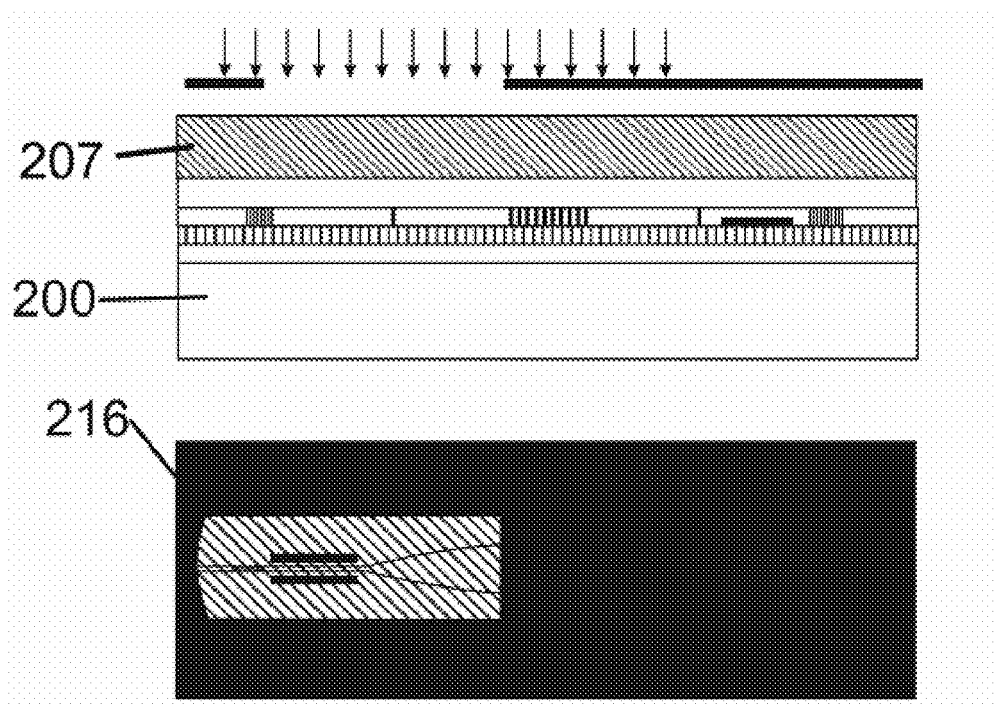
FIG. 2*c* shows a lateral view of a subsequent process step for fabrication of the high-index planar waveguide, and a corresponding top view, in accordance with an embodiment of the invention.

3) In a third processing step, as shown in FIG. 2c, a UV cross-linkable polymer film (207) is then spin-coated on the underlying substrate, and is aligned and exposed through a photo-mask using the UV light to partially cure the UV cross-linkable polymer film (207) for creating a lens section of the coupler. A top view with a metal mask layer (216) and the formed structure from this process is also shown in FIG. 2c.

Figure 2D:
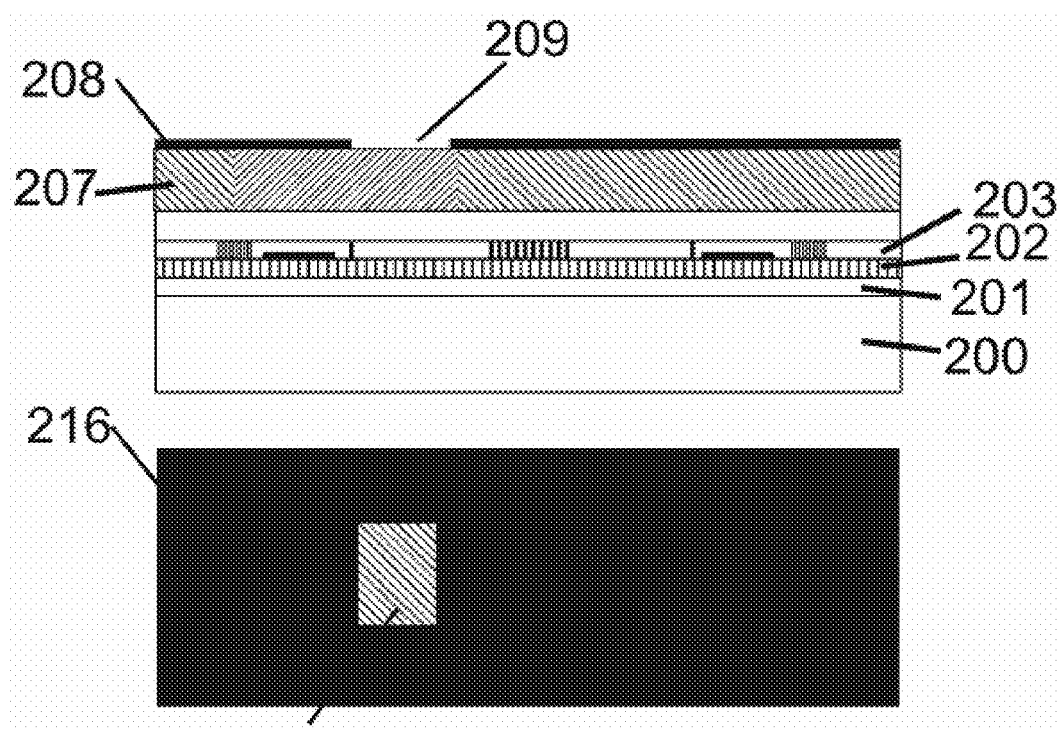
FIG. 2*d* shows a lateral view of a subsequent process step for fabrication of the high-index planar waveguide, and a corresponding top view, in accordance with an embodiment of the invention.

4) In a fourth processing step, as shown in FIG. 2d, the UV cross-linkable polymer film (207) is baked, and a metal layer (208) or a UV absorbing material is deposited on the substrate, aligned and patterned or exposed to form an opening (209) in the metal layer or make UV absorbing material transparent for a subsequent exposure step. A top view with the metal layer (216), the opening (209), and the formed structure are also shown in FIG. 2d.

Figure 2E:
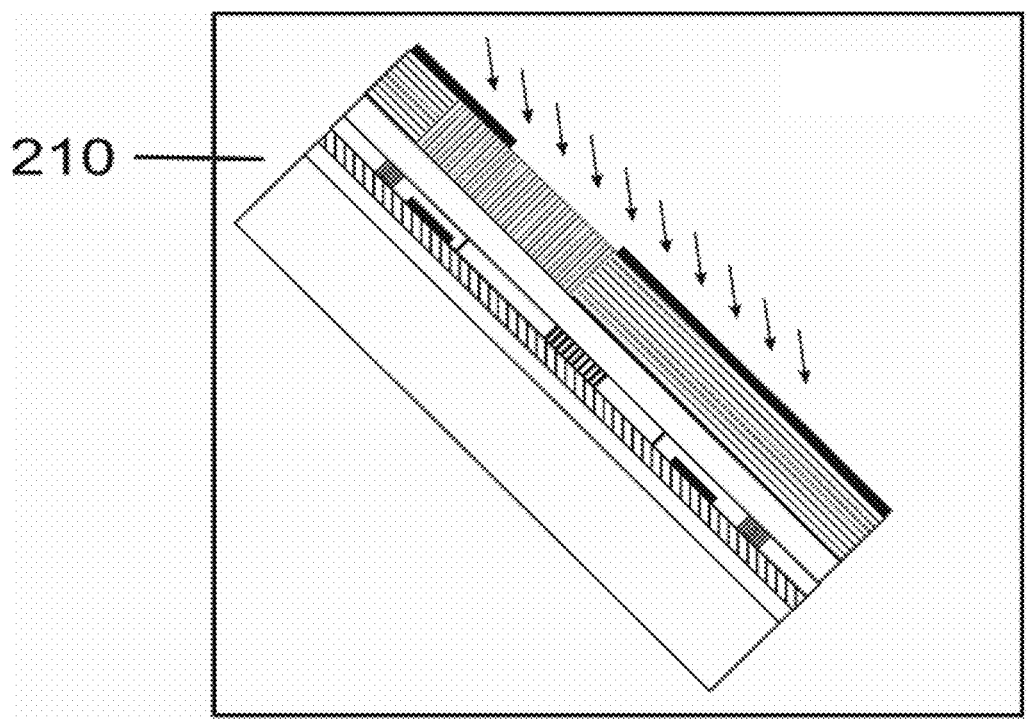
FIG. 2*e* shows an offset lateral view of a subsequent process step for fabrication of the high-index planar waveguide, in accordance with an embodiment of the invention.

5) In a fifth processing step, as shown in FIG. 2e, the substrate with all the layers is then exposed to UV light to cure the UV cross-linkable polymer film (207) to form a micro-mirror section of the coupler. In order to do this, the substrate is placed in a liquid container (210) and is exposed to UV light at an offset angle, as shown in FIG. 2e.

Figure 2F:
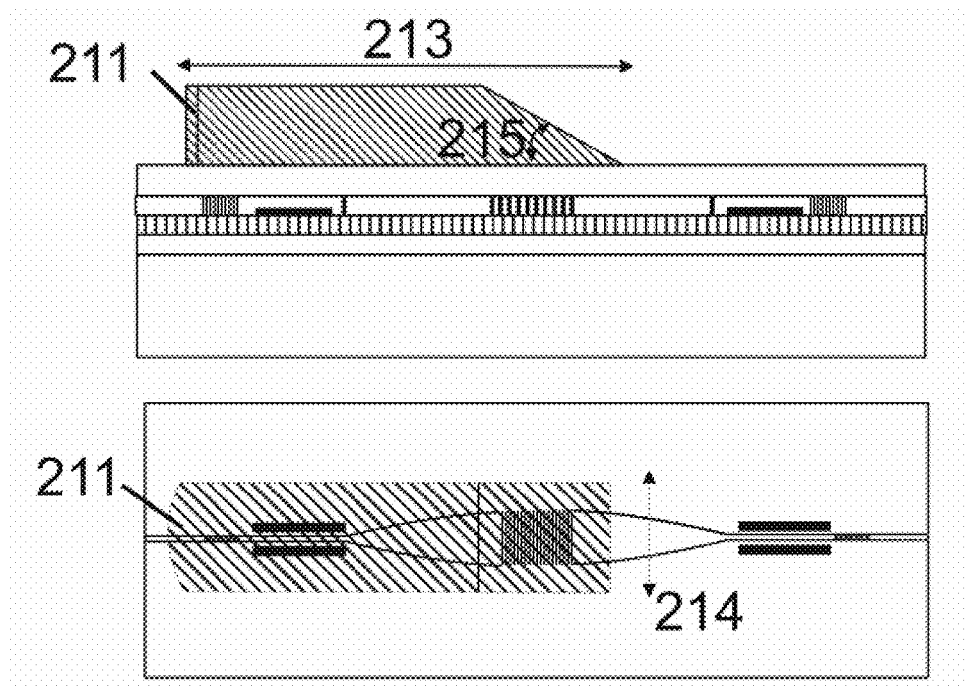
FIG. 2*f* shows a lateral view of a subsequent process step for fabrication of the high-index planar waveguide, and a corresponding top view, in accordance with an embodiment of the invention.

6) Subsequently, as shown in FIG. 2e and FIG. 2f, the metal layer (208 in FIG. 2d and FIG. 2e) is then removed, and the photo-sensitive polymer layer is then developed, thus forming a polymer coupling section (211).

Figure 2G:
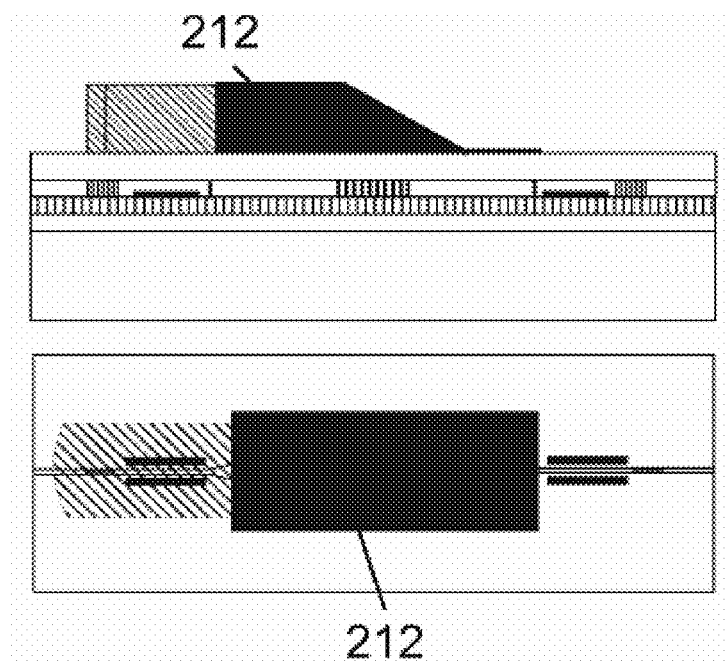
FIG. 2g shows a lateral view of a subsequent process step for fabrication of the high-index planar waveguide, and a corresponding top view, in accordance with an embodiment of the invention.

7) Then, in a subsequent processing step as shown in FIG. 2g, a metal reflecting surface layer (212) is then deposited through an opening in a mask to form a required reflection surface on the mirror top surface. FIG. 2f also shows a top view of the coupler and the high-index contrast waveguide, showing the polymer coupling section (211) and the width of the coupler (214).

Moreover, in one embodiment of the invention, the substrate (200) is silicon and may incorporate electronic circuits that can be integrated with the optical circuits. The lower cladding layer (201) is an optically transparent material with thicknesses between 200 nm to several microns and the material can be a silicon dioxide ($SiO_2$) layer grown on silicon using thermal oxidation method or other low refractive index materials. This layer is needed to confine the light in the core region of the waveguide. The slab core region layer (202) can be an electro-optic material, such as lithium niobate, lithium tantalate, or other electro-optic materials such as silicon or InP, and can be made by transferring a thin layer of electro-optic materials from a lithium niobate crystals to the substrate (200) by using ion implantation and crystal ion slicing as disclosed in previous publications (P. Rabiei, Appl. Phys Lett. Vol 85, No. 20, p 4603-4605). This layer can have different orientations of the crystal and the thickness can vary between 50 nm to a few microns depending on the applications.

The top ridge waveguide layer (203) can be a high-index layer containing high refractive index oxide elements, such as niobium pentoxide, lanthanum oxide, boron trioxide, titanium oxide, tantalum oxide, zichornium oxide, silicon nitride, silicon, aluminum nitride, gallium nitride or other high refractive index materials, such as chalcogonide materials or other high-index materials. The thickness of this layer is between 50 nm to a few microns, depending on the operation wavelength. This layer can be deposited using various methods, such as e-beam evaporation, sputtering, or spin coating. An optical circuit pattern is written on a resist layer (204) on top of this layer using standard nanofabrication methods, such as deep UV lithography and e-beam lithography, and etched using plasmas. If an etching method is used, a hard etch mask layer may be formed by deposition and etching, or a lift off method. The hard mask layer can be metals, such as chrome, or dielectrics, such as $SiO_2$. Alternatively, the high-index glass layer can be deposited and patterned in one step using lift off method.

In the embodiment of the invention as shown in FIGS. 2a–2h, the coupling polymer section (211) can have a thickness between 10 microns to 500 microns depending on the design. Various polymer materials that can be UV cross linked may be utilized to make this layer. For example, SU-8 may be a suitable material for fabricating this layer. Preferably, the polymer is deposited using spin coating. As shown in FIG. 2f, the length of the device (213) can be as small as 10 microns to several mm long depending on the design. Furthermore, the width of the coupler (214) can be as small as 10 microns to several hundred microns, depending on the design.

Furthermore, the focal length of the cylindrical lens formed by the coupling polymer section (211) can be as small as five microns to several hundred microns, depending on the design. As shown in FIG. 2f, the angle for the mirror (215) can be adjusted based on the design, and can vary between 30 degrees to 80 degrees depending on the design. As shown in FIG. 2g, the metal reflecting surface layer (212) is deposited on the mirror to reflect the light off the mirror. The metal layer may be gold, silver, or other highly reflective layers.

Figure 2H:
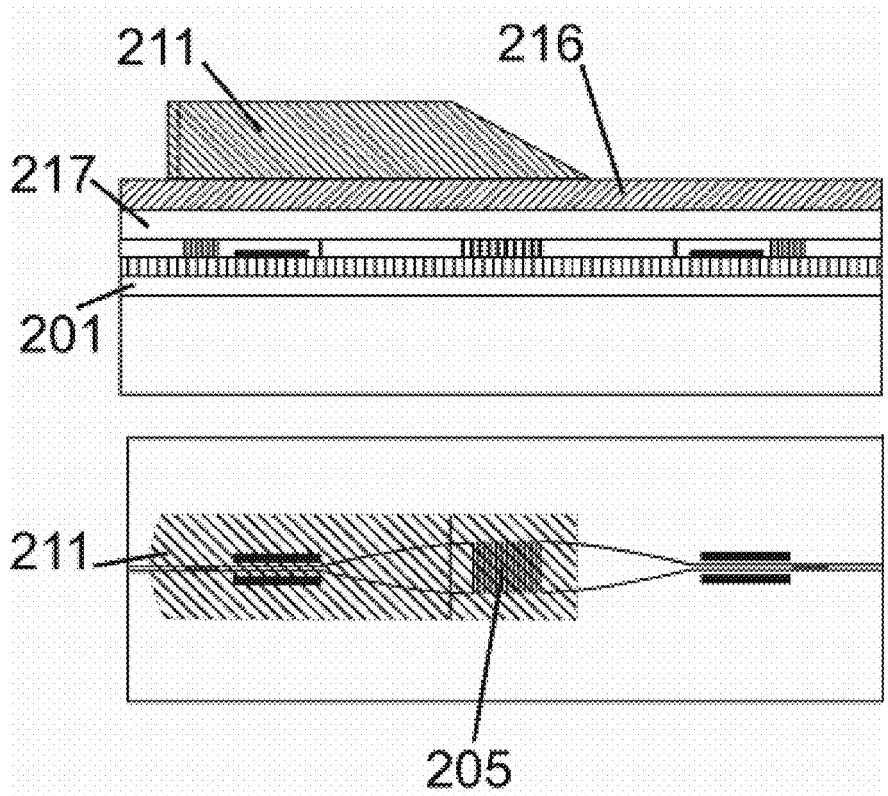
FIG. 2h shows a lateral view of a subsequent process step for fabrication of the high-index planar waveguide, and a corresponding top view, in accordance with an embodiment of the invention.

Alternatively in some coupling devices, it might be needed to couple light to a small mode size to improve the coupler bandwidth. In order to achieve this, a high-index material (216) can be deposited in between the top cladding layer (217) and the mirror (i.e. coupling polymer section (211)), as shown in FIG. 2h. This layer formed with the high-index material (216) reflects the light emitted by the grating coupler section (205). With the silicon substrate (200), the high-index material (216) forms a Fabry Perot cavity, which can improve the coupling efficiency of the grating coupler. This layer thickness is preferably approximately ¼ of the wavelength of the optical signal in the high-index material. Furthermore, the thicknesses of the top cladding layer (217) and bottom cladding layer (201) should be adjusted appropriately in order to achieve maximum coupling. The material for this layer can be high-index glass similar to ridge core region (203), or other high-index materials such as titanium oxide, tantalum oxide and similar materials. Alternatively, in order to improve the grating efficiency, the grating may be etched into both the high-index ridge layer or the high-index electro-optic material.

In addition, in one embodiment of the invention, by moving the semiconductor laser position with respect to planar high-index contrast waveguide, it is possible to tune the wavelengths of optical signal coupled between the semiconductor laser and high-index contrast waveguide. Various novel devices, such as tunable lasers, can be made in this fashion.

Figure 3:
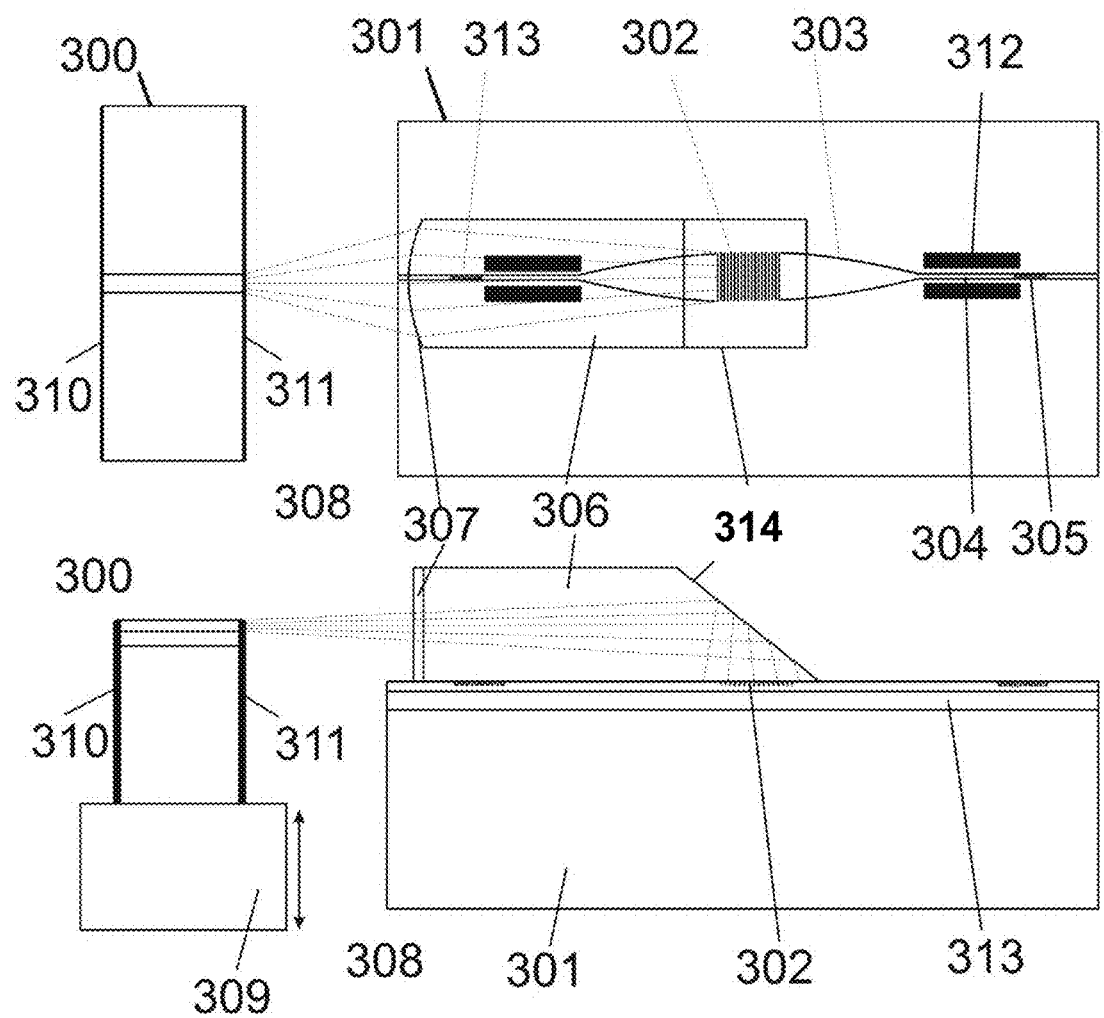
FIG. 3 shows a tunable laser apparatus that includes a grating coupler, a mirror coupler, a lens, mirrors, phase tuning sections, and a semiconductor laser, in accordance with an embodiment of the invention.

In some embodiments of the invention, it may be advantageous to tune the wavelength of optical signal, which is coupled between the semiconductor laser and the planar high-index contrast waveguide. An example of such embodiments is shown in FIG. 3, which utilizes a semiconductor laser (300). The semiconductor laser utilized in this example may be anti-reflection (AR) coated (311), or high reflection (HR)-coated (310) to form an external cavity laser. The emission from the semiconductor laser is collected by the coupler, and is coupled to the high-index contrast optical waveguide platform. Subsequently, mirrors (305, 313) then partially reflect light coupled to the high-index contrast waveguide, and send the light back via the coupler to the semiconductor laser.

As shown in FIG. 3, a cavity is formed between the mirrors (305, 313) in the high-index contrast waveguide and the HR-coated (310) reflecting surface of the semiconductor laser. The phase of the cavity is controlled by applying a voltage to the electrodes (312), which in turn changes the refractive index of the electro-optic slab layer (314). The laser is tuned by moving the semiconductor laser position with respect to high-index contrast waveguide in the vertical position using piezoelectric nano-positioners (309) and simultaneously controlling the phase using the voltage applied to the electrodes (304) of the device. Extra elements, such as wavelength lockers, detectors, and an electronic controller unit, are typically required to control the module (not shown in the figure).

Figure 4:
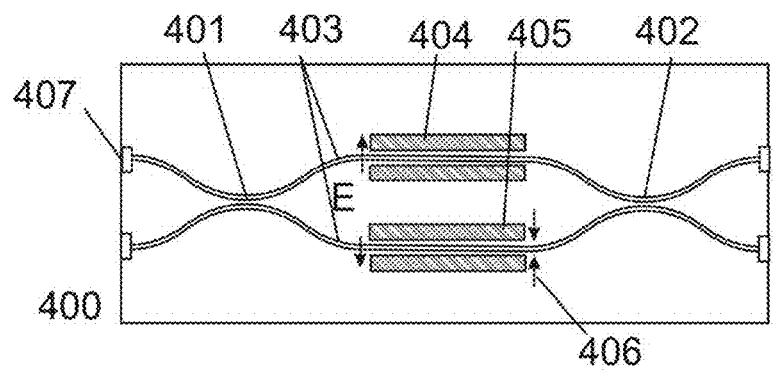
FIG. 4 shows an example optical circuit, known as "Mach-Zehnder circuit," for modulation and/or switching of optical signals by applying an electrical signal, in accordance with an embodiment of the invention.

As an example of a low-loss optical waveguide produced by a method of fabricating a waveguide in accordance with an embodiment of the invention, FIG. 4 shows an optical circuit (400) with a plurality of waveguides which forms a modulator device. In general, a modulator device is used to modulate optical intensity or a phase of optical signals by using a radio frequency (RF) electric signal. This modulator comprises two directional couplers (401, 402) and two arms (403) that are produced using the method of fabricating high-index contrast waveguides, as described previously in one or more embodiments of the invention. Furthermore, two low-loss optical waveguides (403) produced by the deposition of high refractive index material as described previously in one or more embodiments of the invention are also part of the modulator device in FIG. 4. Furthermore, in the optical modulator example as shown in FIG. 4, two electrodes (404, 405) are used to apply electrical RF signal to the optical modulator to change the refractive index of the lithium niobate slab waveguides (403). Because the confinement of the mode is high, the gap (406) between the electrodes can be as small as 2 microns in one example. Therefore, a low modulation voltage is required, compared to a conventional low-confinement optical modulator in lithium niobate for modulation. The integrated coupler (407), as described in association with FIG. 1a and FIG. 1b in one embodiment of the invention, are used to couple light between an optical fiber and the modulator or between a semiconductor laser and the modulator.

Figure 5:
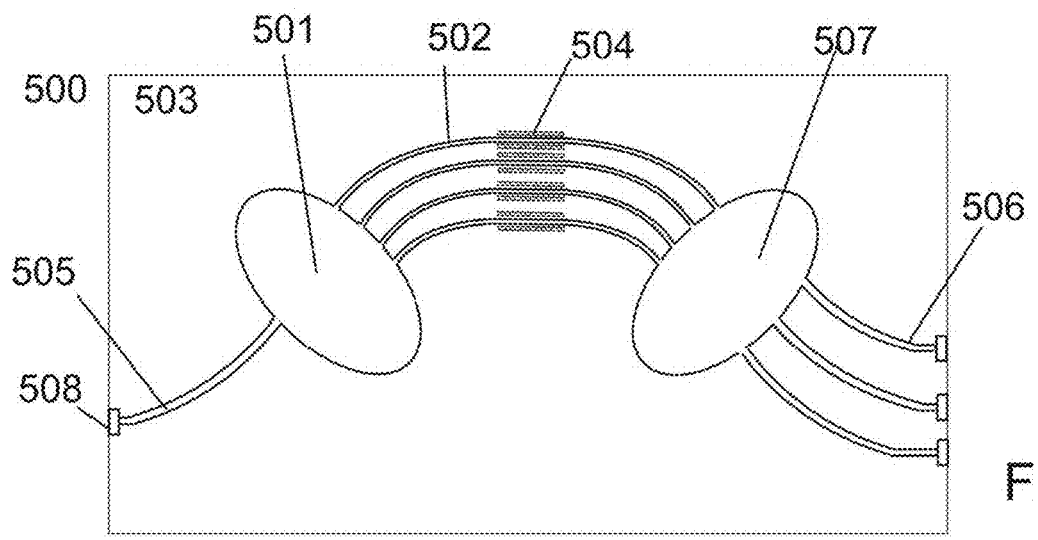
FIG. 5 shows an example optical circuit for an array waveguide grating device that can be tuned by applying an electrical signal to array waveguide grating arms, in accordance with an embodiment of the invention.

As another example of an optical circuit that can be produced using a method of producing a high-refractive index contrast waveguide in accordance with an embodiment of the invention, FIG. 5 shows a tunable array waveguide grating device (500) produced using the method of producing the high-refractive index contrast waveguide. An array waveguide grating device comprises an input optical waveguide (505), an input star coupler (501) that couple light between inputs and arms, a plurality of waveguide arms (502) that transport the energy between the input star coupler (501) and an output star coupler (507), and a plurality of output waveguides (506). The input and output waveguides (505, 506), the star couplers (501, 507), and the arms (502) of array waveguide grating can be defined by the nano-patterning of the high refractive materials as described previously in accordance with an embodiment of the invention.

Continuing with FIG. 5, the slab region (503) of all the waveguides may be lithium niobate or lithium tantalate. Electrodes (504) can be deposited on a surface substrate to control the refractive index of the arms (502) of the tunable array waveguide grating device to enable tuning of the tunable array waveguide grating device. This device can behave as a tunable optical filter. The tuning is achieved by applying an electrical signal to at least one of the electrodes (504). The applied electrical signal changes the refractive index of the lithium niobate slab region (503) in order to achieve tuning function. Typically, different electrical voltage levels are needed for each arm to achieve the tuning.

Because the electro-optic effect is used, the tuning function can be achieved very rapidly and is influenced by the speed of the applied electrical signal. In this particular example as shown in FIG. 5, integrated couplers (508), as described in association with FIG. 1a or FIG. 1b, are used to couple optical energy to the tunable array waveguide device at input and output interfaces to an optical fiber or a semiconductor laser.

Figure 6:
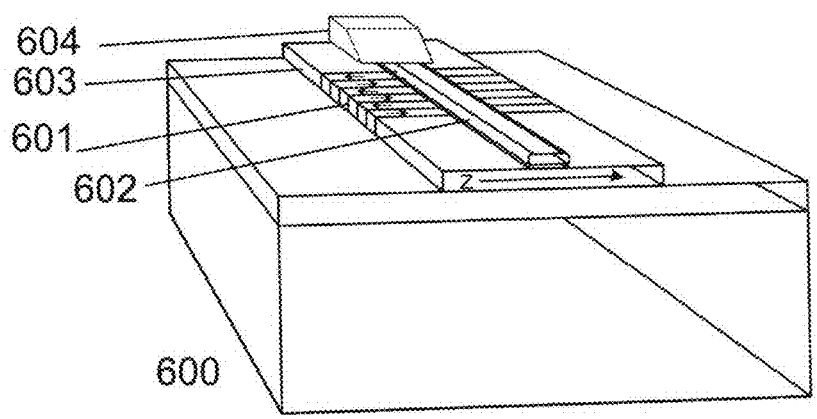
FIG. 6 shows an example optical circuit with periodically domain-inverted lithium niobate or lithium tantalate waveguide that can be used for transferring optical energy among different optical wavelength bands, in accordance with an embodiment of the invention.

Another example of a device that can be produced based on the a novel method of fabricating high-confinement optical waveguides in accordance with an embodiment of the invention is a periodically domain-inverted lithium niobate crystal waveguide. FIG. 6 shows a structure for a periodically domain-inverted lithium niobate waveguide (600) that can be fabricated in accordance with an embodiment of the invention. A periodically domain-inverted lithium niobate waveguide can be used for conversion of optical wavelength or for amplification of optical signals. Because of the confinement of the waveguide in this particular example is substantially large, the efficiency for nonlinear optical processes is very high (i.e. because for a given power, the intensity of optical signal is large).

One or more embodiments of the present invention, which disclose a novel method of producing an optical waveguide, can be applied to the manufacturing of a periodically domain-inverted lithium niobate crystal waveguide. For example, a ridge structure (602) is fabricated on lithium niobate or lithium tantalate slab layer (603), as described previously for the novel method of producing the optical waveguide. For production of the periodically domain-inverted lithium niobate crystal waveguide, an extra step may be needed to etch the slab layer to form periodic-poled domains (601). The periodically-poled domains (601) in the structure are formed by applying a spatially-periodic potential to the −z and +z face of the crystal, which is conducted after the etching step. The periodically domain-inverted domains in the periodically domain-inverted lithium niobate crystal waveguide convert optical energy between different wavelengths. This device can be used to convert or mix optical energy in different optical wavelengths, or to amplify a weak optical signal by mixing it with another strong optical signal in order to amplify the weak signal. In this particular example as shown in FIG. 6, integrated couplers (604), as described in association with FIG. 1a and FIG. 1b in one embodiment of the invention, are integrated with the periodically domain-inverted lithium niobate crystal waveguide in order to achieve efficient optical coupling between the device and optical fiber or between the device and a semiconductor laser.

Figure 7:
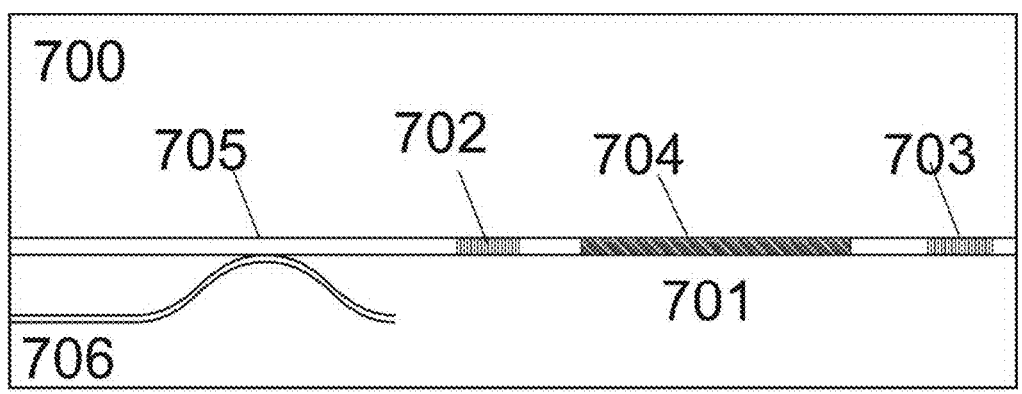
FIG. 7 shows an optical circuit for generation of a laser light using rare-earth doped sections (e.g. erbium), in accordance with an embodiment of the invention.

As another example of an optical circuit that can be produced using a method of producing a high-refractive index contrast waveguide in accordance with an embodiment of the invention, FIG. 7 shows a solid state laser device produced using the method of producing the high-refractive index contrast waveguide. The laser devices as shown in FIG. 7 comprises a cavity 701 that is formed between two mirrors 702 and 703. The gain section 704 of the device comprises a rare earth doped section. It is well known that rare earth element such as erbium or neodymium can be doped into lithium niobate crystal and the high-index ridge section to achieve spontaneous emission gain for amplification of light. The high-index contrast waveguide fabrication methods as described above can be used in order to make the waveguide solid state laser according to one of the embodiment of the current invention. Using high-index contrast waveguides, it is possible to achieve higher gain since the intensity of light in the core of the waveguide is higher. The rare earth elements can be doped into the slab region 700 or the ridge region 704 or both regions according to the design of the laser. The grating sections 702-703 can be produced in the ridge section of the high-index contrast waveguide during the etching step of high-index material or it can be further etched into the slab region. A coupler 705 for the pump laser light is needed to pump the rare earth doped elements and can be designed and fabricated according to one of the embodiments of the current invention.

Figure 8:
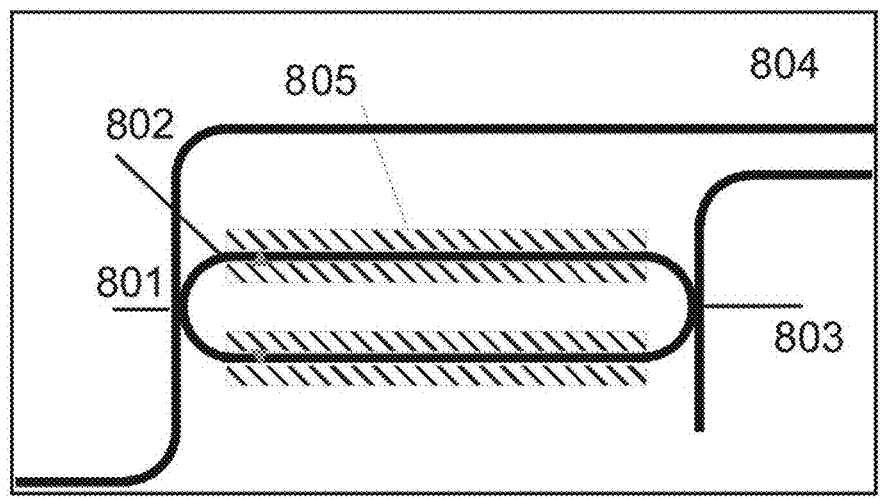
FIG. 8 shows a micro-ring optical circuit for modulation and/or switching of optical signals by applying an electrical signal, in accordance with an embodiment of the invention.

As another example of an optical circuit that can be produced using a method of producing a high-refractive index contrast waveguide in accordance with an embodiment of the invention, FIG. 8 shows a micro-ring modulator device produced in accordance with an embodiment of the invention. A micro-ring modulator device, as shown in FIG. 8, comprises an input coupler (801) that couples light between an input waveguide and a micro-ring resonator (802), and an optional output waveguide (803). The output waveguide (803) and the rest of the micro-ring structure, as shown in FIG. 8, can be made by method of fabrication of high-index contrast waveguide, as described previously in accordance with an embodiment of the invention.

Continuing with FIG. 8, the slab region (804) for all of the waveguides in the micro-ring modulator device can be made from lithium niobate or lithium tantalate. Furthermore, electrodes (805) can be deposited on a surface substrate to control the refractive index of the micro-ring resonator (802) to enable modulation. This device can behave as a tunable optical filter or an optical modulator. The tuning is achieved by applying an electrical signal to at least one of the electrodes (805). The applied electrical signal changes the refractive index of the slab region (804) in order to achieve tuning or modulation function.

Figure 9:
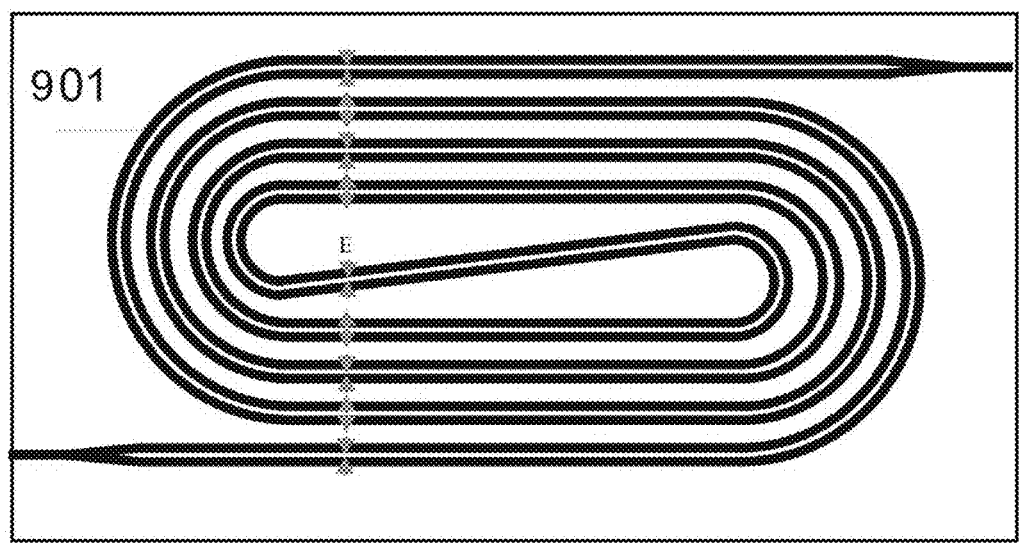
FIG. 9 shows an optical circuit, known as the "Mach-Zehnder circuit with folded arms," for modulation and/or switching of optical signals by applying an electrical signal, in accordance with an embodiment of the invention.

As another example of an optical circuit that can be produced using a method of producing a high-refractive index contrast waveguide in accordance with an embodiment of the invention, FIG. 9 shows a Mach-Zehnder modulator device produced in accordance with an embodiment of the invention. The Mach-Zehnder modulator devices, as shown in FIG. 4, are typically very long (i.e. more than 1 cm long) because of the weak electro-optic effect. By using the high-index contrast waveguide technology as described in various embodiments of this invention, it is possible to "fold" the Mach-Zehnder modulator device as shown in FIG. 9. The arms (901) of the Mach-Zehnder modulator device are shown in FIG. 9. Preferably, the electrodes are placed with alternate voltage in order to achieve modulation. For simplification of the figure, the electrodes are not drawn in FIG. 9. It is possible to achieve traveling-wave RF electrodes in this structure, but the polarity of the wave must be alternated, as shown in FIG. 9, to function as a modulator.

Figure 10A:
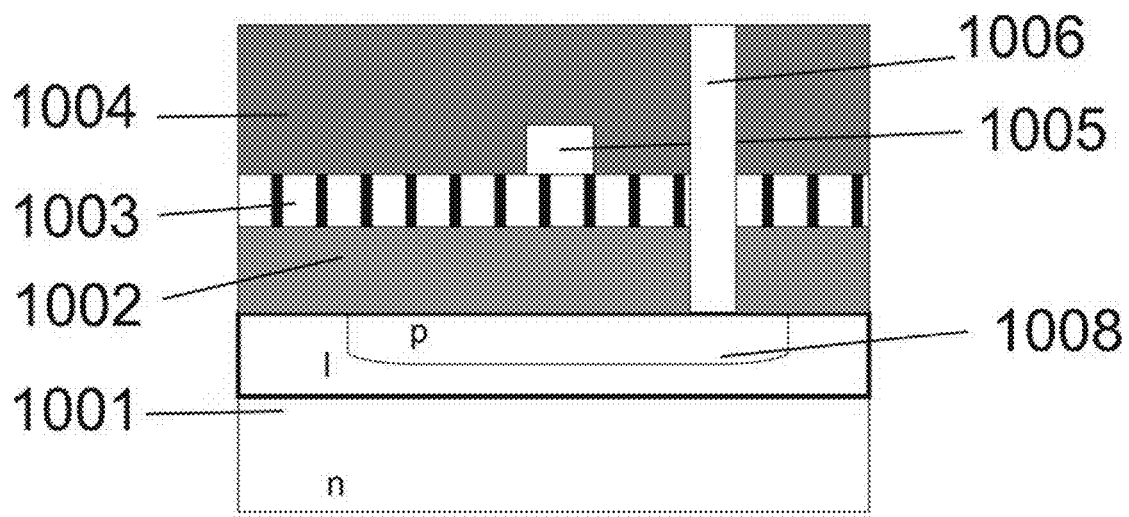
FIG. 10a shows a cross sectional view of a photodetector device, which is integrated with a high-index contrast optical waveguide, in accordance with an embodiment of invention.
Figure 10B:
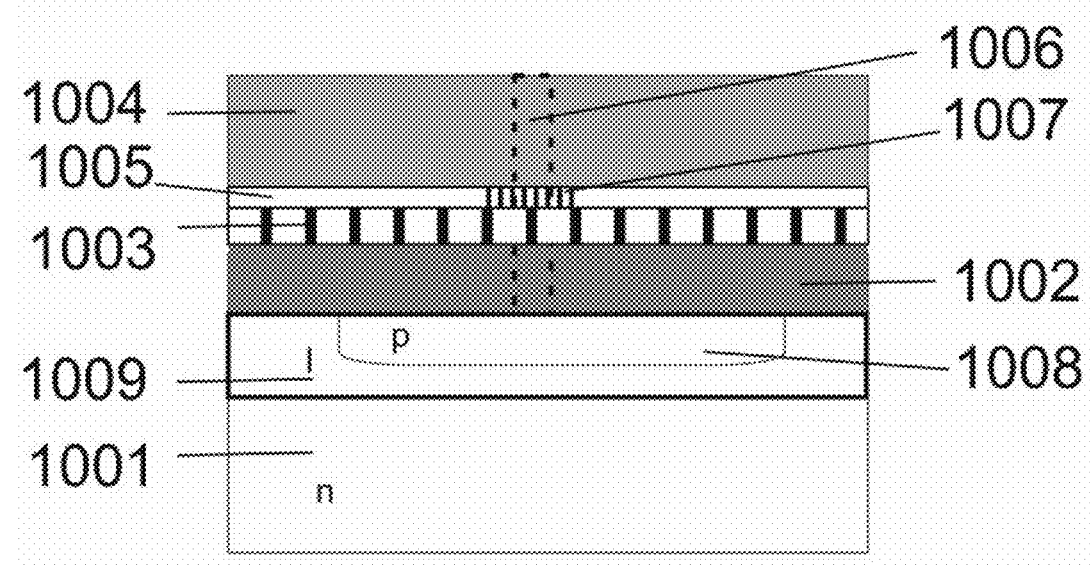
FIG. 10b shows another cross sectional view of a photodetector device, which is integrated with a high-index contrast optical waveguide, in accordance with an embodiment of invention.

As another example for an optical device that can be made in accordance with an embodiment of this invention, FIG. 10a and FIG. 10b show cross sections of a detector device defined in a silicon substrate integrated with a high-index contrast optical waveguide. The detector comprises a PIN junction, a p-doped region (1008), an n-doped region (1001), and the intrinsic silicon region (1009). The lower cladding region (1002), electro-optic slab layer (1003), and the rib layer (1005) form the high-index contrast waveguide. The guided mode is reflected toward the detector using a grating section (1007). The interconnect layers (1006) are made using standard micro-fabrication methods.

As shown in FIG. 10a and FIG. 10b, the slab core region (1003) can be made from lithium niobate or lithium tantalate in this embodiment. The high-index ridge region (1005) is made from high-index materials. Furthermore, contact regions (1006) are fabricated to detect the photo-current in the detector. The detector device formed in this manner enables a complete integrated optical platform comprising modulators, lasers, multiplexers, de-multiplexers, external semiconductor lasers, and optical fibers in a compact device that can be used for a variety of applications.

Figure 11:
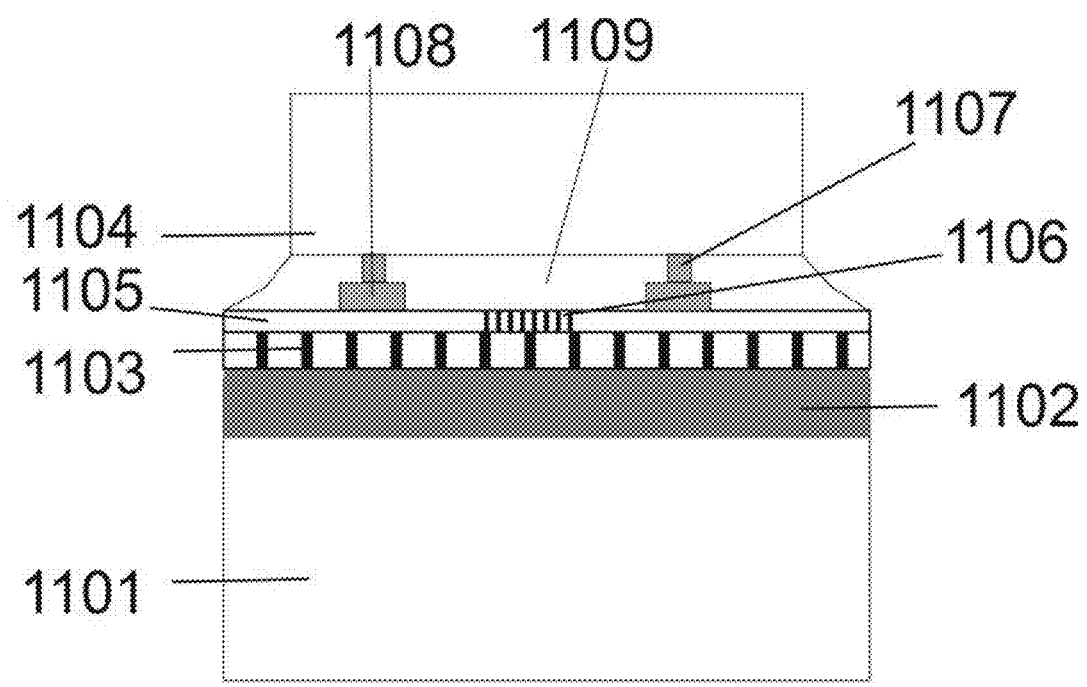
FIG. 11 shows an optical assembly made by flip-chip bonding of an optoelectronic device to a high-index contrast optical waveguide die, in accordance with an embodiment of the invention.

As another example of an optical assembly that can be made in accordance with an embodiment of this invention FIG. 11 shows an optical assembly that is made by flip chip bonding of an optoelectronic device (1104) to the high-index contrast optical waveguide die (1100). Standard flip chip bonding techniques known to the person skilled in the art can be used for this purpose.

The optoelectronic device (1104) can be a photo-detector, or a vertical cavity surface emitting laser (VCSEL). The high-index contrast device have a lithium niobate or lithium tantalate slab region (1103) and a ridge waveguide (1105) region made from high-index material. The guided mode is coupled vertically using the grating coupler device (1106). The waveguide core compromising the slab and the ridge layers are encapsulated between the cladding regions (1102). A top reflecting thin layer (1110) as was discussed previously can be used in order to improve the coupling efficiency of the grating coupler to couple to small mode size devices. Flip chip solder bumps and pads (1107) and (1108) are shown in FIG. 11. An epoxy layer (1109) is used for final encapsulation.

Various embodiments of the present invention introduce one or more novel methods to produce optical waveguides. In one embodiment of the invention, an optical waveguide is produced by deposition and etching of high-index materials on lithium niobate or lithium tantalate thin films to make high-index contrast optical waveguide circuits.

Furthermore, in one embodiment of the invention, a novel optical coupler device comprises a grating coupler, a micro-mirror, and a micro-lens that are integrated with the high-index contrast waveguide and are produced using standard micro-fabrication methods. This novel optical coupler not only resolves at least some problems with aligning and coupling optical energy from a plurality of optical fibers to the high-index contrast waveguide, but also enables efficient optical coupling between a semiconductor laser diode and the high-index contrast optical waveguide.

Moreover, in another embodiment of the invention, a novel method to couple optical energy from a semiconductor laser to the high-index contrast optical waveguide enables a wavelength-selective coupling which can be used to construct a tunable laser diode. The tuning is achieved by moving the laser diode position with respect to the high-index contrast waveguide position.

Many optical circuits, such as array waveguide grating, periodically poled nonlinear optical circuits, micro-resonators, optical modulators, solid state lasers, and numerous integrated platforms combining these optical circuits can be made based on one or more embodiments of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An optical assembly apparatus for coupling optical energy between a high-index contrast waveguide and a light source, the apparatus comprising:

a high-index contrast waveguide fabricated on a base substrate with an optical coupling section;

a grating coupler etched onto a horizontal surface of the high-index contrast waveguide;

a lithographically-defined and aligned micro mirror with an acute angle formed in a non-cladded single solid polymer layer made of a UV cross-linkable polymer material, wherein the non-cladded single solid polymer layer has an uncovered top surface and is constructed on top of the grating coupler, and wherein the acute angle is configured to redirect the light source into the grating coupler to form a perpendicular ray entry angle with the grating coupler on the horizontal surface of the high-index contrast waveguide; and the light source aligned to the optical coupling section.

2. The optical assembly apparatus of claim 1, wherein the light source originates from a semiconductor die emitting a laser beam, which is aligned and placed next to the high-index contrast waveguide fabricated on the base substrate.

3. The optical assembly apparatus of claim 1, wherein the light source originates from an optical fiber aligned, attached, or placed next to the high-index contrast waveguide fabricated on the base substrate.

4. The optical assembly apparatus of claim 1, further comprising a waveguide taper located adjacent to the grating coupler, wherein the waveguide taper couples and narrows a beam width of a light ray emerging from the grating coupler.

5. The optical assembly apparatus of claim 1, wherein the high-index contrast waveguide fabricated on the base substrate is made from at least one of lithium niobate, lithium tantalite, silicon nitride, aluminum nitride, and silicon.

6. The optical assembly apparatus of claim 1, wherein the lithographically-defined and aligned micro mirror is made from an epoxy-based negative photoresist or a UV cross-linkable polymer material with a thickness ranging from 10 microns to 200 microns and a length of 30 microns to 1 millimeter and an acute angle between 30 degrees to 80 degrees.

7. The optical assembly apparatus of claim 3, wherein the optical fiber is directly attached to the high-index contrast waveguide by utilizing UV-curing epoxies.

8. The optical assembly apparatus of claim 1, further comprising a cylindrical micro-lens formed in front of the optical coupling section to focus an incoming beam of the light source with a focal length between 5 microns to 1 mm.

9. The optical assembly apparatus of claim 1, wherein the grating coupler has a particular emission pattern that increases or decreases a grating coupling bandwidth by introducing phase and amplitude in an emission profile via adjustment of a grating grove teeth and period.

10. The optical assembly apparatus of claim 1, wherein the light source originates from a plurality of optical fibers or a plurality of semiconductor dice that are aligned, attached, or placed next to the high-index contrast waveguide fabricated on the base substrate.

11. The optical assembly apparatus of claim 1, wherein a vertical position of light source is adjusted by a piezoelectric element to tune light wavelength between the light source and the high-index contrast waveguide to achieve a tunable laser module.

* * * * *